United States Patent
Fukuda et al.

(10) Patent No.: US 7,277,325 B2
(45) Date of Patent: Oct. 2, 2007

(54) SEMICONDUCTOR MEMORY DEVICE

(75) Inventors: Koichi Fukuda, Yokohama (JP);
Midori Morooka, Yokohama (JP);
Hiroyuki Dohmae, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/412,938

(22) Filed: Apr. 28, 2006

(65) Prior Publication Data

US 2006/0245259 A1 Nov. 2, 2006

(30) Foreign Application Priority Data

Apr. 28, 2005 (JP) .............................. 2005-130891
Nov. 9, 2005 (JP) .............................. 2005-324847

(51) Int. Cl.
*G11C 16/06* (2006.01)
(52) U.S. Cl. ..................... 365/185.22; 365/185.09; 365/185.12
(58) Field of Classification Search ........... 365/185.22, 365/15.09, 185.12
See application file for complete search history.

(56) References Cited

U.S. PATENT DOCUMENTS

| | | | |
|---|---|---|---|
| 5,671,178 A | 9/1997 | Park et al. | |
| 5,909,399 A | 6/1999 | Tanaka et al. | |
| 6,259,630 B1 * | 7/2001 | Kawamura | 365/185.22 |
| 6,831,859 B2 | 12/2004 | Hosono et al. | |
| 6,859,401 B2 | 2/2005 | Hosono et al. | |
| 2006/0050564 A1 | 3/2006 | Kojima et al. | |

* cited by examiner

*Primary Examiner*—Huan Hoang
(74) *Attorney, Agent, or Firm*—Oblon, Spivak, McClelland, Maier & Neustadt, P.C.

(57) ABSTRACT

A semiconductor memory device includes: a memory cell array; a sense amplifier circuit for reading and writing data of the memory cell array page by page; a verify-judge circuit configured to judge write or erase completion based on the verify-read data held in the sense amplifier circuit; and data latches disposed for the respective columns in the memory cell array to be attached to the verify-judge circuit, into which column separation data are written to serve for excluding the corresponding columns from a verifying object, wherein the column separation data are automatically set in the data latches in an initial set-up mode at a power-on time so that at least a part of inaccessible columns for users are excluded from the verifying object.

20 Claims, 15 Drawing Sheets

FIG. 12
| Command B1 | Command B2 | Command B3 |
|---|---|---|
| Use 32 Additional Columns (Separate 32 Columns) | Use 48 Additional Columns (Separate 16 Columns) | Use 64 Additional Columns (Separate No Columns) |
Initial Set-up State:
64 All Additional Columns Separated
FIG. 13A
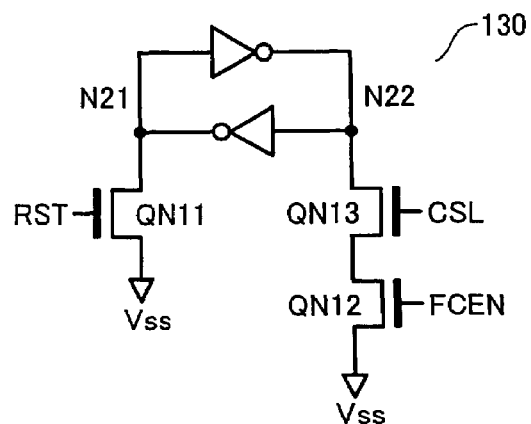
FIG. 13B
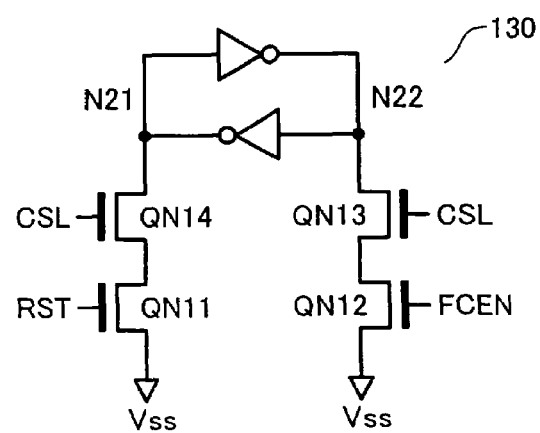

SEMICONDUCTOR MEMORY DEVICE

CROSS-REFERENCE TO RELATED APPLICATION

This application is based on and claims the benefit of priority from the prior Japanese Patent Applications No. 2005-130891, filed on Apr. 28, 2005 and No. 2005-324847, filed on Nov. 9, 2005, the entire contents of which are incorporated herein by reference.

BACKGROUND OF THE INVENTION

1. Field of the Invention

This invention relates to a semiconductor memory device, especially to an electrically rewritable and non-volatile memory (EEPROM).

2. Description of Related Art

As one of EEPROMs, a NAND-type flash memory is known. In the NAND-type flash memory, data write and read are performed page by page. Data write is performed with a write voltage application and a write-verify repeated. To judge internally whether the entire bits in a page have been written or not, there is usually prepared a batch verify circuit (for example, refer to Unexamined Japanese Patent Application Publication No. 2001-250395).

In case the flash memory system has an ECC function inside or outside of the chip, it will be permitted in relation to the ECC function that there are certain fails (i.e., bit fail number or column fail number). Therefore, it is desired in case data write ends in "Fail" that the fail number being detected and judged under a "permissible fail number", it is dealt with "Pseudo-Pass". Considering this point, there has already been provided such a flash memory that Pass/Fail detection is made possible in relation to the permissible fail number (for example, refer to Unexamined Japanese Patent Application Publication No. 2002-140899).

Usually, in a flash memory with a large capacitance, a redundancy system is used for defect-relieving. For this purpose, there is prepared a redundant call array for replacing a defect (for example, defect column) detected in a test before shipment with a redundant column therein. Further in the memory chip, there are prepared a defect address storage circuit and an address match detecting circuit for detecting address matching between an externally supplied address and a defect address stored in the defect address storage circuit. With these circuits, defective address replacing control may be performed.

SUMMARY OF THE INVENTION

According to an aspect of the present invention, there is provided a semiconductor device including:

a memory cell array with electrically rewritable and non-volatile memory cells arranged therein;

a sense amplifier circuit configured to serve for reading and writing data of the memory cell array page by page;

a verify-judge circuit configured to judge write or erase completion based on the verify-read data held in the sense amplifier circuit; and data latches disposed for the respective columns in the memory cell array to be attached to the verify-judge circuit, into which column separation data are written to serve for excluding the corresponding columns from a verifying object, wherein the column separation data are automatically set in the data latches in an initial set-up mode at a power-on time so that at least a part of inaccessible columns for users are excluded from the verifying object.

According to another aspect of the present invention, there is provided a semiconductor memory device including:

a memory cell array with electrically rewritable and non-volatile memory cells arranged therein;

a sense amplifier circuit configured to serve for reading and writing data of the memory cell array page by page;

a verify-judge circuit configured to judge write or erase completion based on the verify-read data held in the sense amplifier circuit; and data latches disposed for the respective columns in the memory cell array to be attached to the verify-judge circuit, into which column separation data are written to serve for excluding the corresponding columns from a verifying object, wherein the device has an operation mode for re-setting the column separation data in the data latches in response to a command input.

BRIEF DESCRIPTION OF THE DRAWINGS

FIG. 12 shows commands for directing additional column separation number to be re-set.

FIGS. 13A and 13B show data latches for storing column separation data.

DETAILED DESCRIPTION OF THE EMBODIMENTS

Illustrative embodiments of this invention will be explained with reference to the accompanying drawings below.

Figure 1:
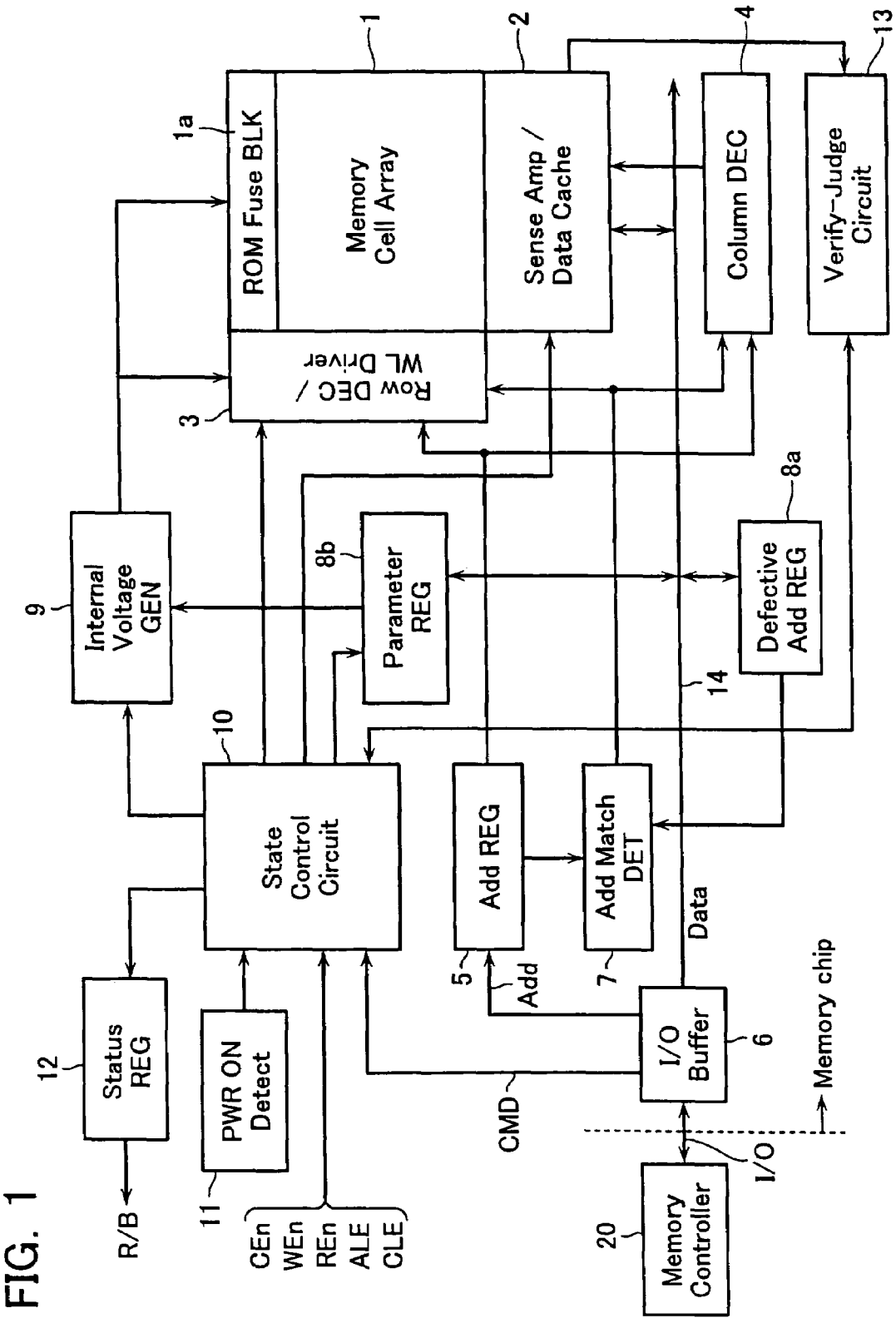
FIG. 1 shows a functional block configuration of a flash memory in accordance with an embodiment of the present invention.
Figure 2:
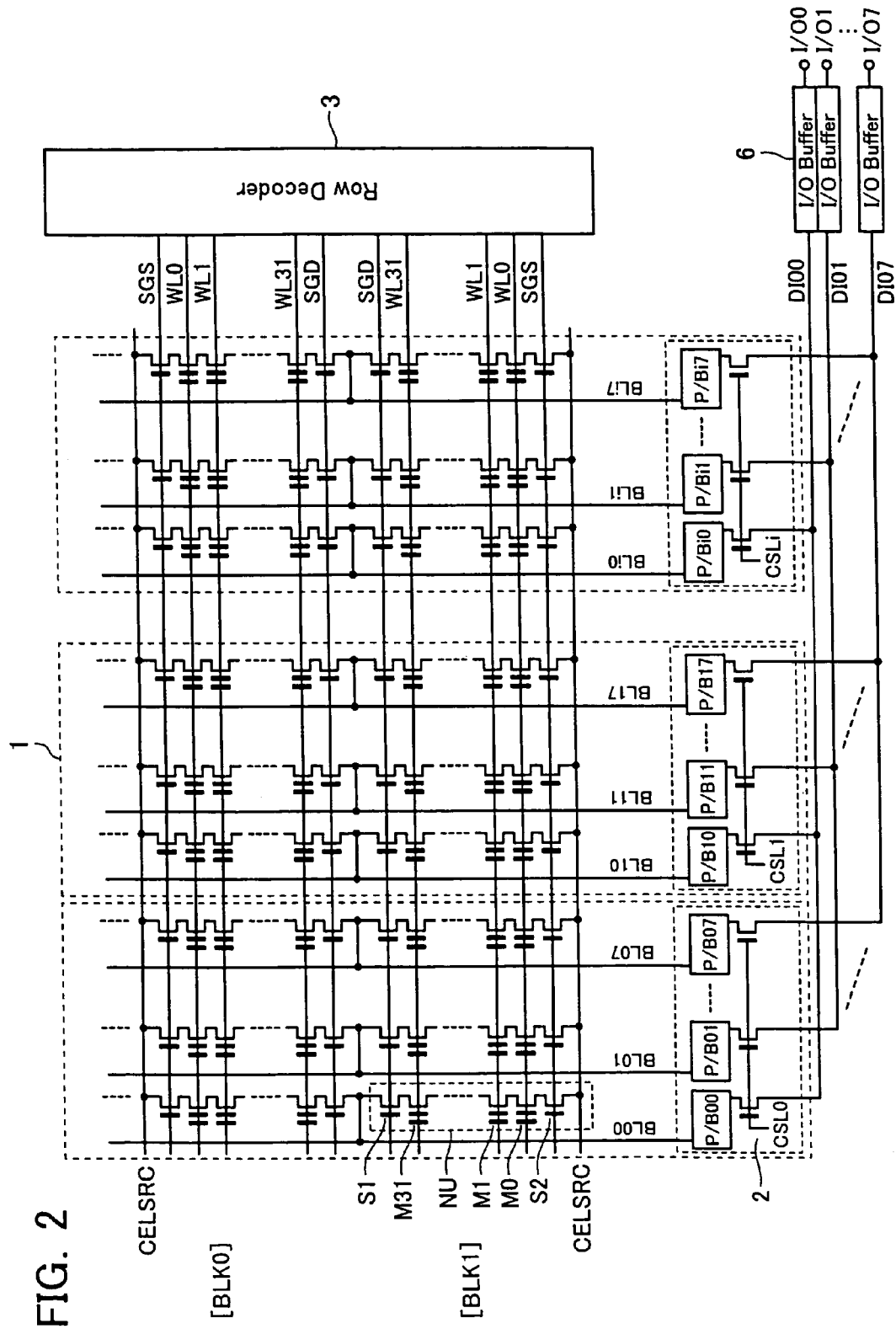
FIG. 2 shows the memory cell array of the flash memory.

FIG. 1 shows a functional block of a flash memory in accordance with an embodiment, and FIG. 2 shows the configuration of the memory cell array 1.

Memory cell array 1 is formed of NAND cell units NU arranged in a matrix manner. Each NAND cell unit NU is formed of a plurality of (thirty two in the example shown in FIG. 2) electrically rewritable and non-volatile memory cells M0-M31 connected in series, and select gate transistors S1 and S2, which couple the both ends thereof to a source line CELSRC and a bit line BL, respectively.

Control gates of memory cells in the NAND cell unit are coupled to different word lines WL0-WL31; and gates of the select gate transistors S1 and S2 to select gate lines SGS and SGD, respectively.

A set of NAND cell units sharing the word lines WL0-WL31 is defined as a block serving as an erase unit. As shown in FIG. 2, plural blocks (BLK0, BLK1, . . . ) are arranged in the direction of the bit line BL.

Row decoder 3 is for selectively driving word lines and select gate lines in accordance with row addresses and includes word line drivers and select gate line drivers. Sense amplifier circuit 2 is coupled to bit lines for read data for a page and serves as a data latch circuit for storing one page read/write data. With this sense amplifier circuit 2, data read and write are performed page by page. Sense amplifier circuit 2 includes a data cache for relaying data between a data bus and itself.

In the example shown in FIG. 2, the sense amplifier circuit 2 includes sense amplifiers P/B each coupled to a corresponding bit line BL. However, as the memory cell array 1 is more miniaturized, it becomes not only difficult to dispose a sense amplifier at each bit line pitch, but also problematic that bit lines are interfered due to capacitance coupling.

Figure 3:
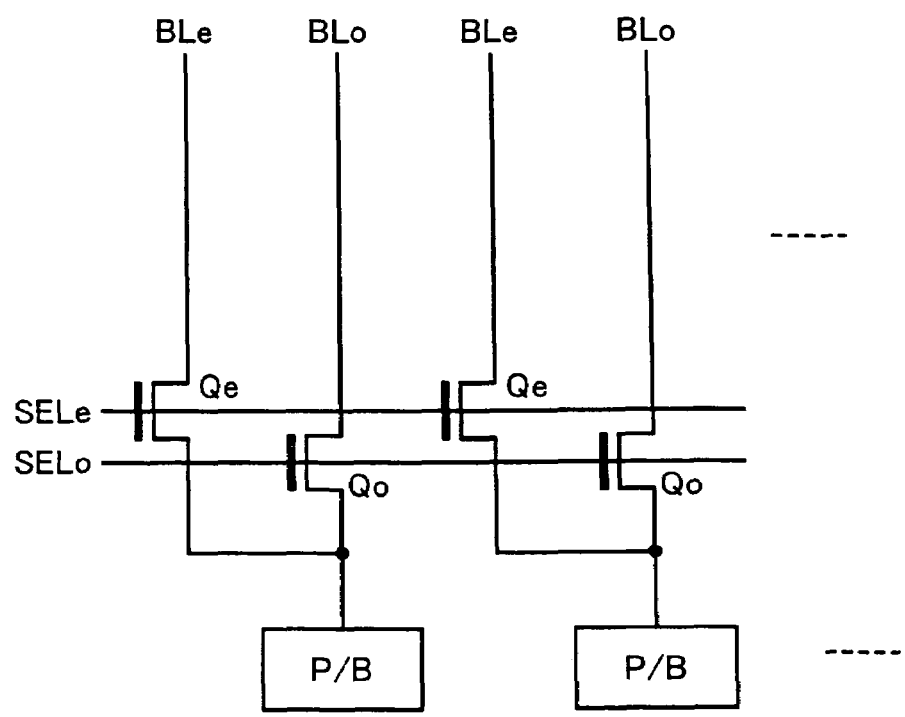
FIG. 3 show an array of sense amplifiers each sharing bit lines.

Therefore, it will be utilized in a flash memory with a large capacitance such a scheme that adjacent two bit lines BLe and BLo share a sense amplifier P/B as shown in FIG. 3. Adjacent two bit lines BLe and BLo are selectively coupled to a bit line BL via bit line select gates Qe and Qo, respectively.

In the Example shown in FIG. 2, a set of memory cells arranged along a word line serves as a sector, in which the entire memory cells are simultaneously accessed. By contrast, in the shared sense amplifier scheme, in which adjacent two bit lines share a sense amplifier, a set of memory cells arranged along a word line constitutes two sectors. In a binary data storage scheme, one sector constitutes one page while in a four-value data storage scheme, one sector constitutes two pages (the upper page and the lower page).

Data transmission between sense amplifier circuit 2 and external input/output nodes I/O is performed via I/O buffer 6 and data bus 14. The sense amplifier circuit 2 includes column gates (not shown) attached thereto, and column decoder 4 controls the column gates. Supposing, for example, that there are eight input/output nodes I/O (I/O0-I/O7), as shown in FIG. 2, one page data will be transferred serially byte by byte (column by column) between sense amplifier circuit 2 and the input/output nodes I/O.

Address "Add" supplied from the input/output nodes I/O is transferred to the row decoder 2 and column decoder 4 via address register 5. Command "Com" supplied from the input/output nodes I/O is transferred to state control circuit prepared in the chip (referred to as an internal controller hereinafter) 10 and decoded therein.

The internal controller 10 executes data write and erase sequence controls and a read operation control based on various kinds of external control signals (e.g., write enable signal WEn, read enable signal REn, command latch enable signal CLE, address latch enable signal ALE and the like) supplied via memory controller (referred to as an external controller) 20 disposed outside of the chip.

For example, the memory chip and the external controller 20 are integrally installed to constitute a memory card or the like, and a host device uses the memory card in such a way as to supply a command to the memory chip via the external controller, thereby setting a required operation mode.

An internal voltage generation circuit 9 is prepared to generate various voltages necessary for data write, erase and read under the control of the internal controller 10. In the internal voltage generation circuit 9, boost circuits are used for generating internal voltages higher than the power supply voltage. A status register 12 is prepared to output a status signal R/B, which designates that the chip is in a busy state of a write, erase or read operation or a ready state, to the external of the chip.

Data registers 8a and 8b store various initial set-up data for defining memory operation conditions. In detail, data register 8a serves as a defective address register for storing defective address data in the initial set-up data. By contrast, data register 8b stores various parameter data such as voltage trimming data for adjusting various internal voltages, used/unused additional column information data (i.e., data informing whether each additional column is used or unused) and the like as described later.

Data to be stored in these data registers 8a and 8b have been written into an initial set-up data storage area (i.e., ROM fuse block) 1a in the memory cell array 1. The power being on, power-on detecting circuit 11 detects it. Receiving the output signal from power-on detecting circuit 11, the internal controller 10 executes automatically such an initializing operation as to read the initial set-up data in the ROM fuse block 1a, and transfer and set them in the data registers 8a and 8b.

Note here that there may be prepared another initial set-up data storage circuit for storing at least part of the initial set-up data as different from the initial set-up data storage area 1a set in the memory cell array 1. For example, the initial set-up data storage circuit may be formed of a laser-blowing type of fuse circuit, an electrically programmed fuse circuit, a non-volatile memory circuit with the same memory cells used in the memory cell array 1 and the like.

Address match detect circuit 7 detects address match between the externally supplied address and a defective address stored in the defective address storage circuit 8a to generate an address replace control signal, with which a redundant column is selected in place of a defective column.

To judge the write completion based on the verify-read result held in the sense amplifier circuit 2 in a write mode, there is prepared a verify-judge circuit (i.e., batch verify circuit) 13, which is attached to the sense amplifier circuit 2.

Figure 4:
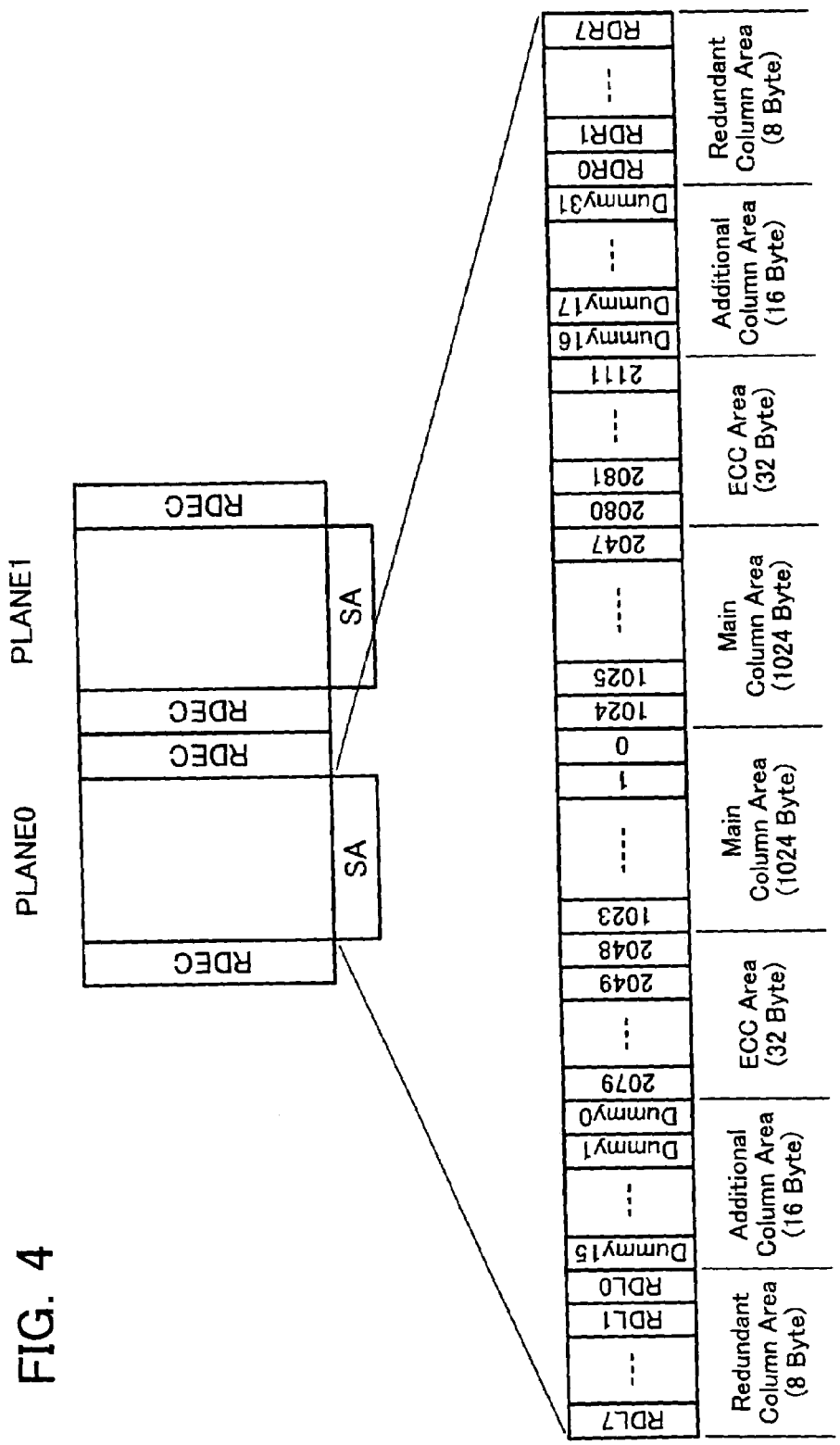
FIG. 4 shows a column structure of one page of the flash memory.

FIG. 4 shows a column structure example of one page in the memory cell array 1. In detail, in FIG. 4, in case two memory planes PLANE0 and PLANE1 each having sense amplifier circuit SA and row decoder RDEC are disposed, the column structure of one plane is shown. That is, one page contains: 2×1024 Byte main column areas; 2×32 Byte ECC areas; 2×16 Byte additional column areas: and 2×8 Byte redundant column areas.

Note here that the "additional column" is such a column that is closed to general users, but is open only to specified users. The additional column includes, for example, an additional ECC area used for improving data reliability, a management area for managing wear leveling, write-protect and the like, a data expansion area and the like, which are open to only specified uses or are used by the memory chip itself.

Figure 5:
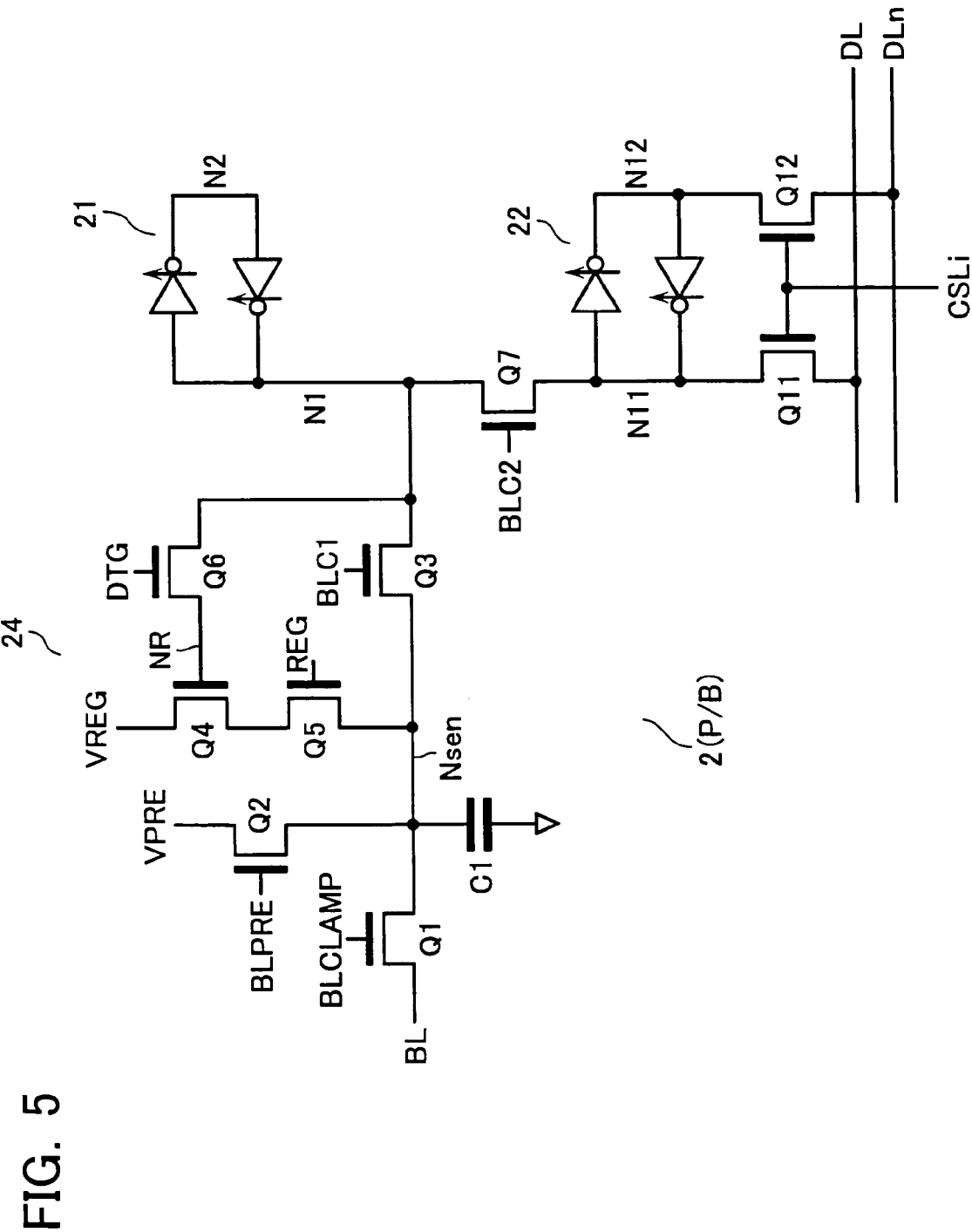
FIG. 5 shows a sense amplifier configuration.

FIG. 5 shows a detailed configuration of the sense amplifier P/B in the sense amplifier circuit 2. NMOS transistor Q1 disposed between sense node Nsen and bit line BL serves for clamping the bit line precharge voltage and serves as a pre-sense amplifier for amplifying bit line voltage. Further coupled the sense node Nsen is precharge NMOS transistor Q2, and charge holding capacitor C1 if necessary.

The sense node Nsen is coupled to one data node N1 of data latch 21 via transferring NMOS transistor Q3. To temporarily store read data, a data storage circuit 24 is disposed between the data node N1 and sense node Nsen. The gate of NMOS transistor Q4 therein, the drain of which is coupled to a voltage node VREG, serves as a data storage node NR. Data transfer NMOS transistor Q6 is disposed between the data storage node NR and the data node N1. To transfer the voltage VREG to the sense node Nsen in accordance with data held at the storage node NR, NMOS transistor Q5 is disposed between the NMOS transistor Q4 and sense node Nsen.

Data storage circuit 24 serves as a write back circuit, which stores write data in the former cycle in a verify-read mode, and writes back "0" data to the data latch 21 with respect to only insufficiently "0" written cells. In other words, data latches 21 of one page are controlled to be in an all "1" state only when the entire bits of one page have been completely written.

Further coupled to the data node N1 via transferring NMOS transistor Q7 is another data latch 22 serving as a data cache. One page read/write data are transferred at a time between data latches 21 and 22. Data nodes N11 and N12 of data latch 22 are coupled to complementary data lines DL and DLn via column select gates Q11 and Q12, which are driven by a column select signal CSLi.

Figure 6:
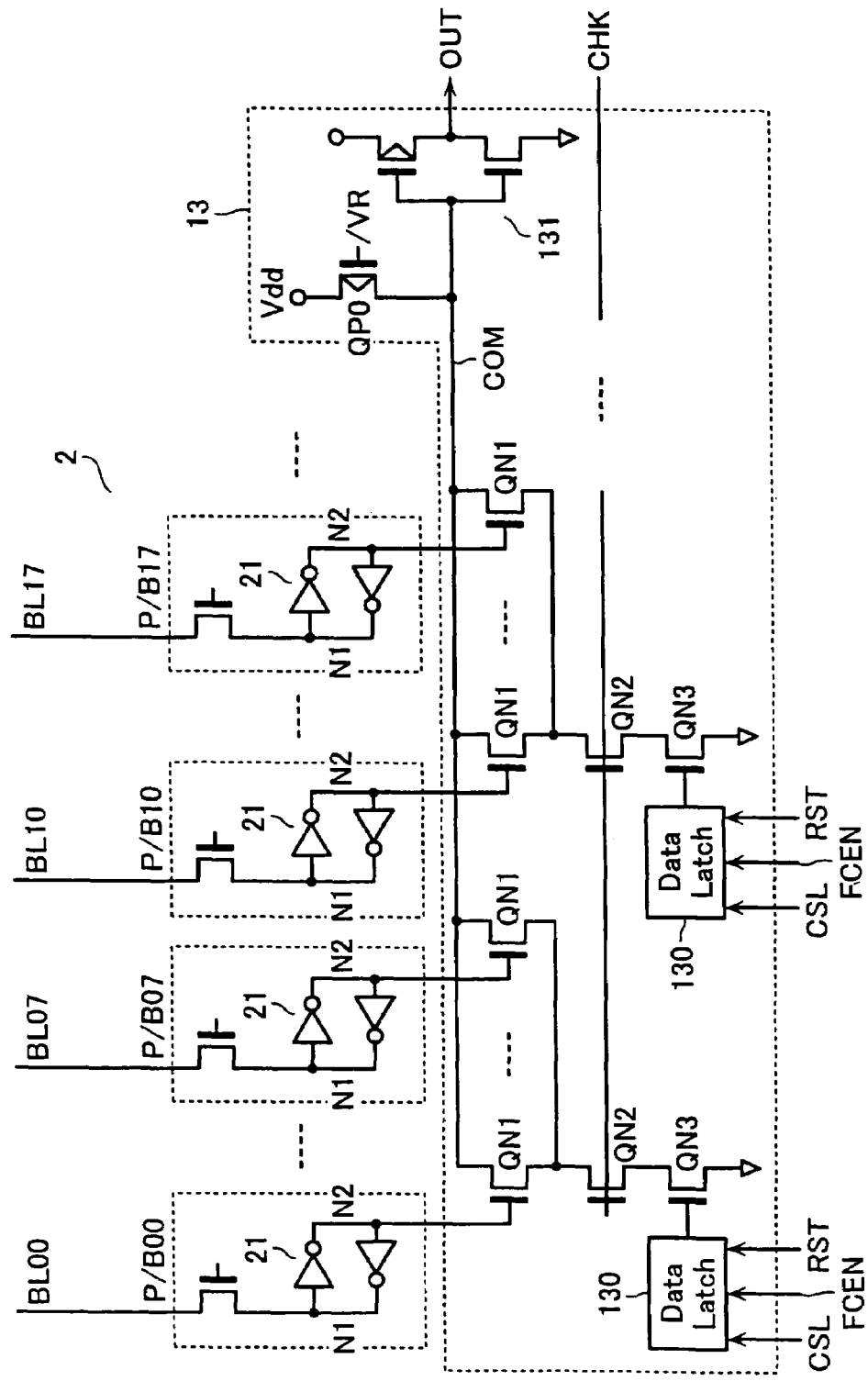
FIG. 6 shows an example of a batch verify circuit in the flash memory.

FIG. 6 shows a configuration example of the batch verify-judge circuit 13. "COM" is a detection line used for detecting write completion of the entire bits of one page in a lump. This detection line "COM" is usually disposed as shared by main column area, ECC area and additional column area. To precharge this detection line COM to Vdd at a verify time, PMOS transistor P0 is coupled to it, the gate of which is driven by a signal /VR.

The detection line COM being not discharged to be "L" in response to the signal CHK check, it designates that the entire bits have been written while the detection line being discharged to "L", it designates that there is an incompletely written column. The level transition of the detection line COM is output through an output circuit 131.

To detect the existence of incompletely written columns, there are prepared NMOS transistors QN1, each gate of which is coupled to data node N2 of each sense amplifier P/B. Drains of these transistors QN1 are coupled to the detection line COM while sources thereof are coupled in common for each column. Each common source is coupled to Vss via NMOS transistor QN2 driven by the check signal CHK and via NMOS transistor QN3 driven by the output of data latch 130.

As described above, when one page write is completed, data latches 21 in the sense amplifier circuit 2 become to be an all "1" state (i.e., the entire data nodes N2 are set in an "L" state). At this time, NMOS transistors QN1 are kept off, and the detection line COM is kept in the "H" level. By contrast, if there is at least one cell, which is insufficiently written, the corresponding NMOS transistor QN1 turns on. At this time, NMOS transistor QN2 being on in response to the check signal CHK; and NMOS transistor QN3 being driven by data latch 130 to turn on, the detection line COM will be reduced in an "L" level. The output circuit 131 receives the detection line level transition to output such a Pass/Fail signal that designates "Fail" in case the detection line COM becomes "L"; and designates "Pass" in case the detection line COM is kept "H".

Data latches 130, which are attached to the verify-judge circuit 13, are disposed for the respective columns in this embodiment to store "column separation data". Each of the column separation data is used for excluding the corresponding column from a verify object. Note here that a "column" is defined by a bit line or a set of plural bit lines in the memory cell array. Therefore, the data latches 130 may be disposed for the respective bit lines to store column separation data, each of which is used for excluding the corresponding bit line from the verify-object.

Data latch 130 has, as shown in FIG. 13A, a reset-use NMOS transistor QN11 coupled to one data node N21, which is driven by a reset signal RST and write-use NMOS transistors QN12 and QN13 coupled in series to the other data node N22. NMOS transistor QN12 is driven by an activation signal (i.e., set signal) FCEN; and NMOS transistor QN13 driven by a column select signal CSL output from the column decoder 4.

One page data latches 130 are reset with the reset signal RST at a time. Into the data latches 130, column separation data may be selectively written based on AND operation between the column select signal CSL and the activation signal FCEN each. The column separation data write is automatically performed, as described later, as part of initial set-up operations at a power-on time.

In this embodiment, to-be-separated columns contain an inaccessible column (or columns) for users in addition to a defective column (or columns). In detail, the "inaccessible column for users" is defined by at least one in the additional column area, which is not permitted to access, and a part of the redundant column area, which is remained as an unused column in the redundant column area.

Supposing that an inaccessible column for users become defective later, users can not exclude it from the verify object because it is inaccessible. The above-described situation being generated, it becomes difficult to output a normal write completion judgment signal.

In this embodiment, with respect to the inaccessible column in addition to the defective column, column separation data is preliminarily written in the data latches 130. The column separation data written into the data latch 130 is defined as such an "L" output that makes NMOS transistor QN3 off. With this column separation data written as explained above, the corresponding column will be excluded from the verify object because that the verify-judging NMOS transistors QN1 of the corresponding column are made disable.

Figure 7:
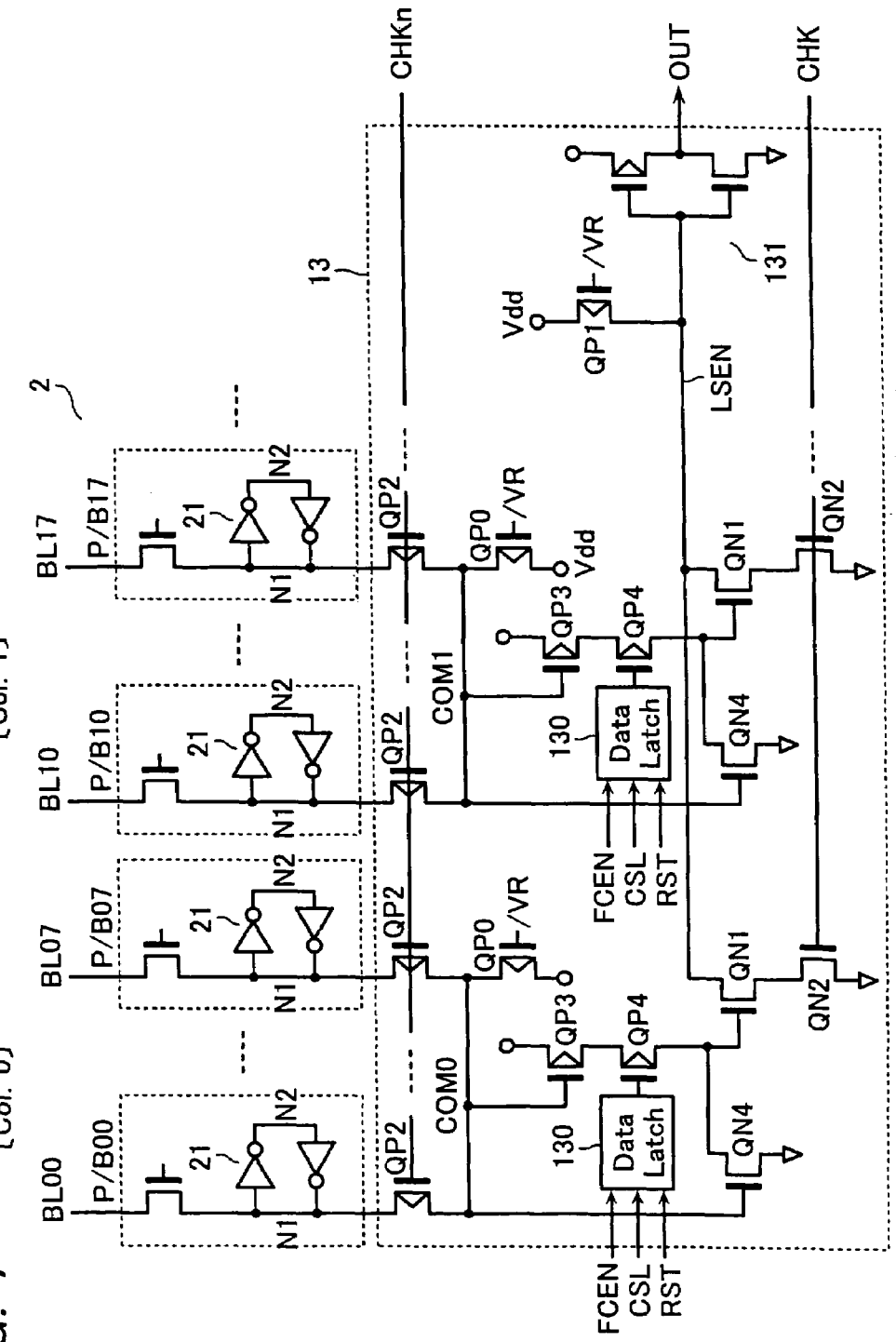
FIG. 7 shows another example of the batch verify circuit in the flash memory.

FIG. 7 shows another example of the batch verify circuit 13. In this batch verify circuit 13, hierarchic verify-judge is performed with first (i.e., lower) detection lines COMi prepared for the respective columns and a second (i.e., upper) detection line LSEN. To simplify the circuit and reduce the circuit area, the detection line LSEN is disposed as shared by the main column area, ECC area and additional column area. These detection lines COMi and LSEN are pre-charged to be Vdd via pre-charge PMOS transistors QP0 and QP1, respectively, prior to the verify-judging.

Disposed between the detection lines COMi and data nodes N1 of the data latches 21 in the sense amplifiers P/B are PMOS transistors QP2, which are on-driven at a verify-judging time. If the entire data nodes N1 are "H" (i.e., write completion) in each column as a result of the verify-read, the detection line COMi will not be discharged even if PMOS transistor QP2 is on. By contrast, in case at least one data node N1 is "L" in a column, the corresponding detection line COMi will be discharged.

To detect the level transition of each detection line COMi, PMOS transistor QP3, the gate of which is coupled to the detection line COMi, and PMOS transistor QP4, the gate of which is driven by data latch 130, are connected between Vdd and the gate of NMOS transistor QN1, which serves for causing the level transition of the detection line LSEN.

As similar to those shown in FIG. 6, separation data will be written into the column separation-use data latches 130 with respect to inaccessible columns for users. Note here that each the separation data is an "H" level for making PMOS transistor QP4 be off, as reversed to that in case of FIG. 6. That is, column separation data being stored in the data latch 130 for a certain column, PMOS transistor QP3, which is used for detecting the level transition of the first detection line COMi of the column, is set to be disabled.

The drain of NMOS transistor QN4, the gate of which is coupled to the detection line COMi, is coupled to the gate of NMOS transistor QN1. Therefore, NMOS transistor QN4 is on during the detection line COMi is kept "H", thereby making NMOS transistor QN1 be off. The source of NMOS transistor QN1 is coupled to Vss via NMOS transistor QN2, which turns on in response to check signal CHK.

When the first detection line COMi is changed to an "L" level for a certain column, PMOS transistor QP3 becomes on and then NMOS transistor QN1 becomes on. In response to this, the detection line LSEN will be changed to an "L" level. This is a state change in such a case that there is an incompletely written column at a write-verify time.

Figure 8:
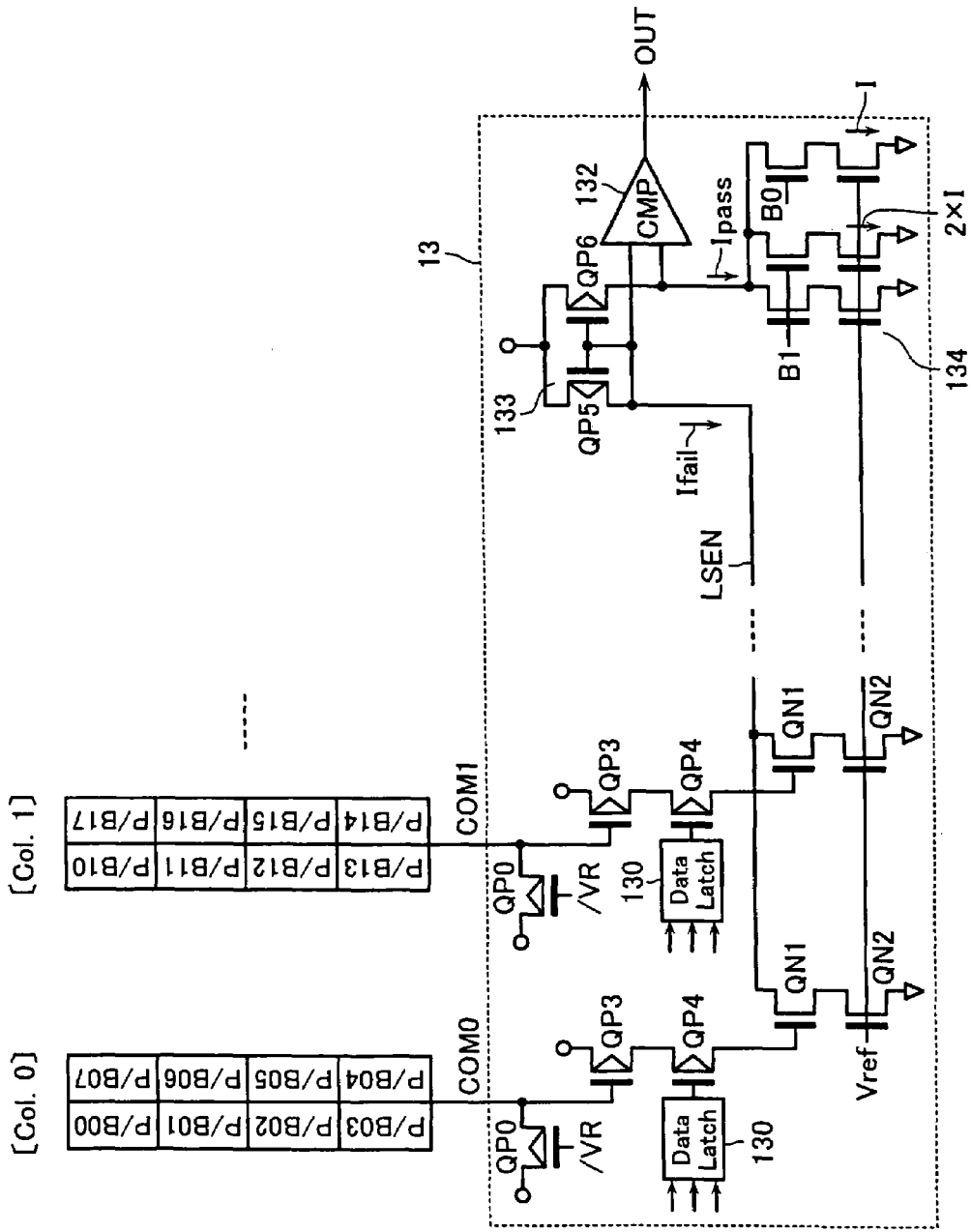
FIG. 8 shows still another example of the batch verify circuit in the flash memory.

FIG. 8 shows still another example of the batch verify circuit 13, the basic configuration of which is the same as that shown in FIG. 7, and includes first detection lines COMi disposed for the respective columns and an upper, second detection line LSEN. PMOS transistor QP2 shown in FIG. 7 is not shown in FIG. 8 because it is disposed in the sense amplifier P/B. To simplify the circuit and reduce the circuit area, the detection line LSEN is disposed as shared by the main column area, ECC area and additional column area.

This verify circuit 13 includes a permissible fail number setting circuit 134 for permitting of column defects to a certain extent. The permissible fail number setting circuit 134 is a kind of reference current source circuit, which is able to drain a certain pass current Ipass selected by select signals B0 and B1. To compare a fail current Ifail, which flows in response to the level transition of the detection line LSEN at when a fail(s) is detected, with the pass current Ipass, there are prepared a current mirror circuit 133 and a comparing circuit 132.

The drain of PMOS transistors QP5, which constitutes the current mirror circuit 133 with PMOS transistor QP6, is coupled to the detection line LSEN while and the drain of PMOS transistor QP6 is coupled to the permissible fail number setting circuit 134.

The fail current Ifail, which flows in the detection line LSEN at a verify-read time, will be changed in corresponding to the number of fails. When the fail current Ifail becomes larger than the pass current Ipass, the comparing circuit 132 outputs a "Fail" signal. As a result, the permissible fail number setting circuit 134 is able to output such a Pass/Fail signal that designates "Pass" until the number of fails reaches a certain value.

In FIG. 8, the detection line COMi is used for detecting Pass/Fail for each column with plural bit lines. By contrast, it is effective in such a case that one bit line serves as one column. In this case, PMOS transistors QP2 in FIG. 7 are driven at different timings from each other, and the permissible fail number setting circuit 134 designates the number of bit line fails to be permitted.

Figure 9:
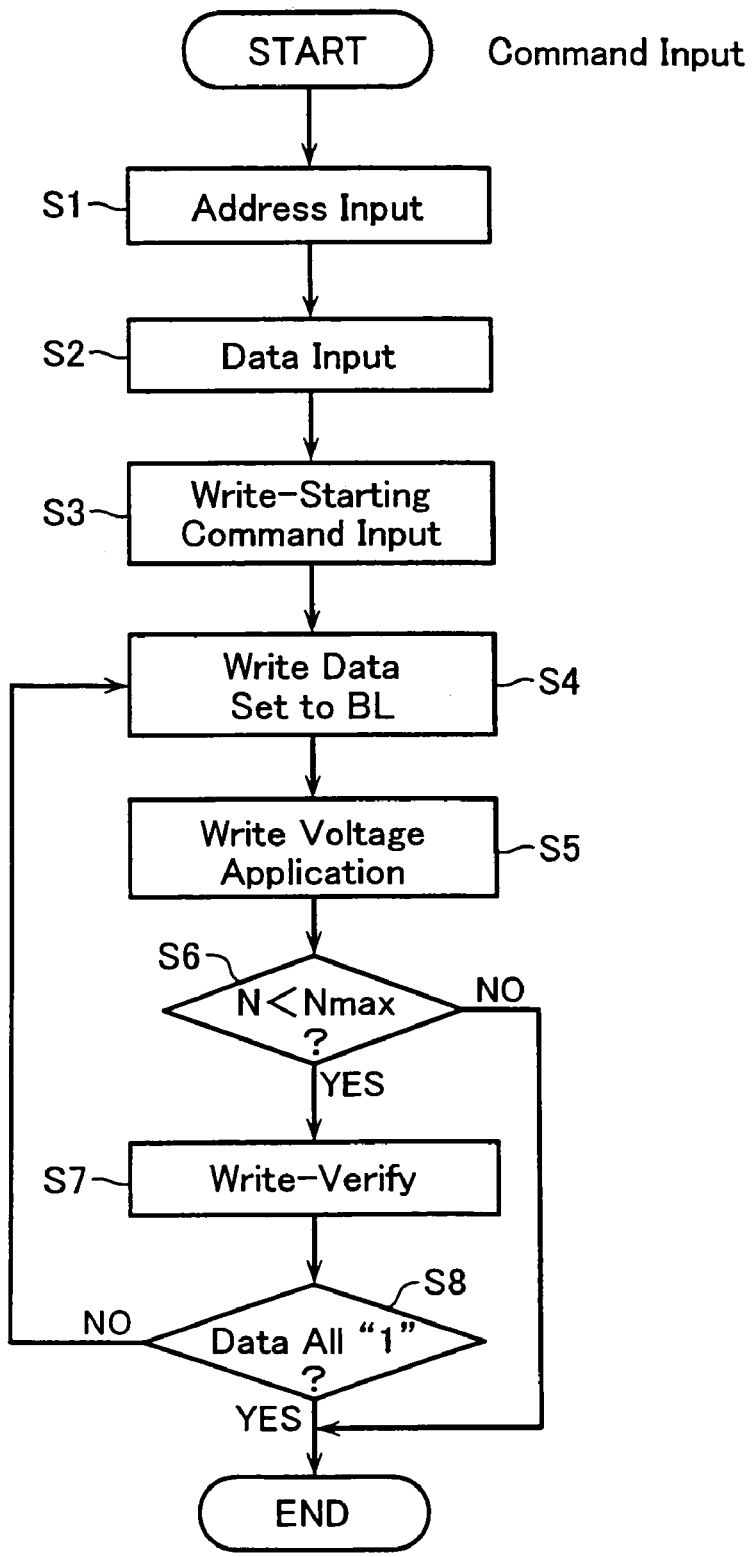
FIG. 9 shows a write sequence of the flash memory.

FIG. 9 shows a write sequence of the flash memory in accordance with this embodiment. Write command being set, this write sequence starts. Following the command input address is input (step S1), and then one page write data are loaded (step S2). Write starting command being input (step S3), data write is automatically executed for a selected page under the control of the controller 10.

Initially, write data voltages are set to corresponding bit lines (step S4). Thereafter, write voltage is applied to a selected word line corresponding to the selected page, and a write operation is performed (step S5).

Explaining in detail, in corresponding to write data "0" and "1", Vss and Vdd are supplied to the NAND cell channels via bit lines from the sense amplifier circuit 2. To supply Vdd to the NAND cell channel to be written with "1" data (i.e., write inhibiting), Vdd+Vth (Vth: threshold voltage of the select gate transistor) or more higher voltage is applied to the select gate transistor. When the gate voltage is reduced, the select gate transistor becomes off, and the NAND cell channel becomes floating.

The selected word line is applied with the write voltage in the above-described state, electrons are injected into the floating gate of a "0" write cell, so that a positive threshold state of "0" data will be written into it. By contrast, in a "1" write cell, electron injection does not occur because the NAND cell channel is boosted in potential.

After the write voltage application, it is detected whether the write cycle number has reached the maximum value Nmax or not (step S6). Having reached the maximum value, the sequence will be forcedly finished (Write Failure). If it has not reached the maximum value, write-verify is performed (step S7).

Step S8 is performed with the above-described batch verify circuit 13 for judging Pass/Fail based on the verify-read result (i.e., for judging the write completion). If data write is not completed, go back to the step S4, and data write is performed again. One page write completion being judged, the write-verify becomes "Pass", and the write sequence ends.

Supposing that, in the above-described write sequence, there is a late-generated column defect(s) (e.g. bit line short-circuit, bit line leakage and so on), the write-verify may not be passed, and the write sequence will be finished in failure. If the late-generated column defect is an accessible one for users, it is possible to set data in the data latches 130 again for excluding the late-generated defective column from the verify object.

The late-generated column defect being, however, an inaccessible one, it is impossible to set the data latches 130 again for excluding the late generated defective column from the verify object. That is, even if there are no defects in the column address area which is accessible for users, write-verify is never passed, and ends in failure.

Considering this fact, in this embodiment, inaccessible columns for users are excluded from the verify object in addition to the defective column, which is found before shipment and replaced with a redundant column. This is automatically performed in the memory chip as one of power-on reset operations.

Figure 10:
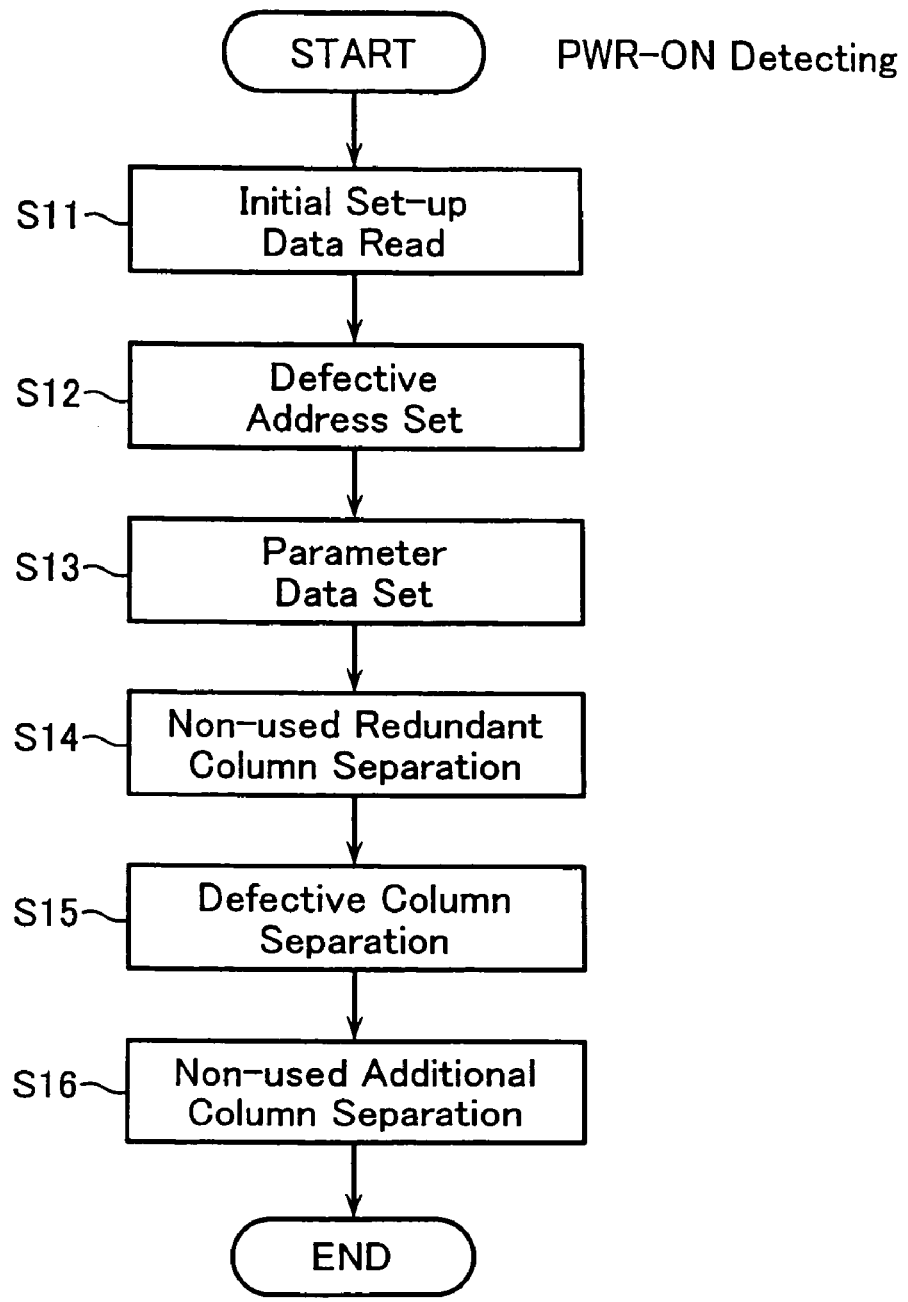
FIG. 10 shows a sequence of the power-on reset operation of the flash memory.

FIG. 10 shows a power-on reset sequence controlled by the internal controller 10. As described above, the initial set-up data area (i.e. ROM fuse area) 1a is prepared in the memory cell array 1, in which various initial set-up data are stored. The initial set-up data include inaccessible column addresses for users in addition to defective column addresses and various parameter data.

The power being on, power-on detecting circuit 11 detects it, and internal controller 10 starts to do an initial set-up operation in response to the output of the power-on detecting circuit 11. Firstly, the initial set-up data stored in the memory cell array 1 are read out to the sense amplifier circuit 2 (step S11). In the read out initial set-up data, defective address data are transferred to and loaded in the defective address register 8*a* (step S12). Other parameter data are transferred to and loaded in the parameter register 8*b* (step S13). Note here that the parameter data include used/unused additional column information data, which are closed to users except a specified user(s).

Next, column separating operations are sequentially performed as follows: a non-used redundant column(s) is separated from the batch verify object (step S14); a defective column(s) is separated from the verify object (step S15); and a non-used additional column(s) is separated from the verify object (step S15). These column separation steps S14-S16 are for setting column separation data in the corresponding data latches 130 in the batch verify circuit 13, and the setting order is not limited to the above described example.

Steps S14 and S15 may be performed with reference to the defective addresses, which have already been stored in the defective address register 8*a* while step S16 may be performed based on the used/unused additional column information data, which have already been stored in the parameter register 8*b*.

According to this embodiment as described above, even if a defect is generated later in inaccessible column area for users, it may be avoided such a situation that it becomes impossible to judge write completion.

The column separation operations in the above-described embodiment are performed in the initial set-up operation after power-on. In this embodiment, however, it is not permitted for users to change the number of additional columns even if users intend to increase. The reason is as follows: the data latches 130 for storing column separation data are, as shown in FIG. 13A, configured to be reset for a page in a lump, and selectively set with the set signal FCEN and the column address signal CSL; and column separation data being set in the data latches 130 once, it becomes impossible to selectively reset those.

The merit of that the number of additional columns is changeable for users will be found, for example, in such a case that users want to make a memory chip operable on a condition severer than the ordinary one. Supposing that while a certain column is normal under the ordinary condition, it become defective under the severer condition, it is required of users to use an additional column in place of the defective column. Further, in case there are such two groups of users that one uses the additional columns, and the other does not use them, it is required of a memory chip maker to prepare two kinds of products, used/unused additional column information data of which are different from each other. This becomes a cause to decrease the product throughput.

Considering the above-described reasons, it becomes necessary that users may set again the column separation data. To make the column separation data re-settable, it will be provided such a method that the column separation data-use data latch 130 is formed as shown in FIG. 13B. That is, the data latch 130 may be selectively reset by a column (or plural columns).

As shown in FIG. 13B, the data latch 130 is formed as being able to be reset by an AND logic of the reset signal RST and the column select signal CSL like the set-side thereof. By use of this data latch, the column separation data, which have been set once, may be selectively reset, so that it makes the corresponding additional column usable.

This method, however, increases the number of elements in the sense amplifier circuit (i.e., bit line control circuit) and the occupied area. By contrast, there will be provided another method making the column separation data re-settable without changing the circuit configuration of the column separation data-use data latch 130, in which the column separation operation is done again in response to an externally input command.

Figure 11:
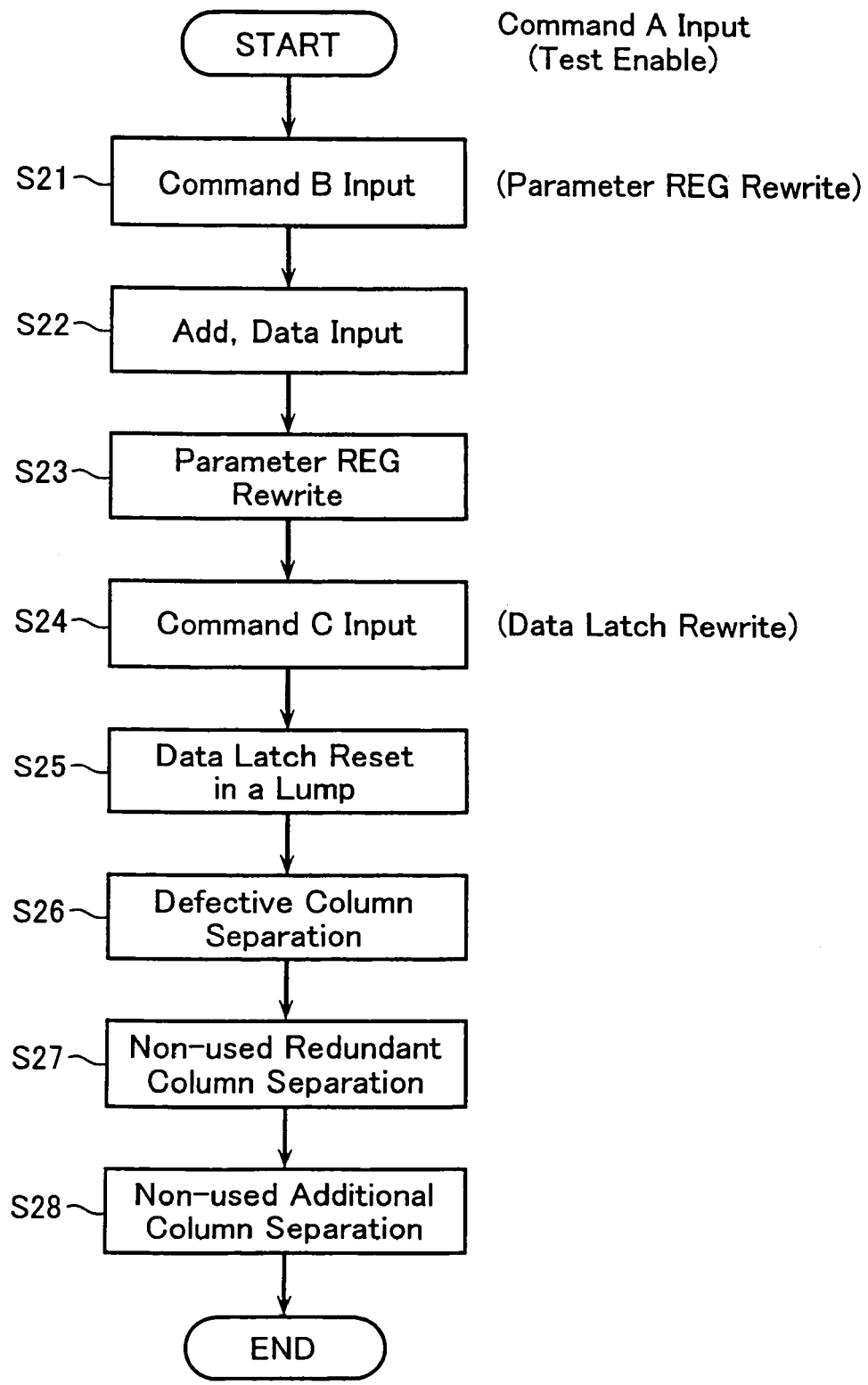
FIG. 11 shows a flow of column separation data re-set operation of the flash memory.

FIG. 11 shows an operation flow of re-setting the column separation data, which is performed as a special operation mode. Command A, i.e., an enable command, being input, the memory chip is set in the operation mode.

Following it command B being set for directing the chip to rewrite the parameter register 8*a* (step S21), and rewriting address and data being input (step S22), the internal controller 10 rewrite the data of the parameter register 8*a* based on the input address and data (step S23). It is supposed in detail here that at least a part of the used/unused additional column information data is changed to "used" from "unused".

Next, command C being input for setting the column separation data (step S24), the internal controller 10 responds to it and resets the entire data latches in the sense amplifier circuit in a lump (step S25). Thereafter, as similar to the corresponding steps explained with reference to FIG. 10, defective column separation data setting (step S26); non-used redundant column separation data setting (step S27); and non-used additional column separation data setting (step S28) are executed successively under the control of the internal controller 10.

As described above, the number of additional columns, which are to be usable, being changeable in accordance with command input, it becomes possible for users to effectively use an additional column for users such as an extended area of the data area, an ECC area for improving the data reliability and other applications. Additionally, according to this scheme, it is not required of the memory producing maker to prepare two kinds of products, the used/unused additional column information data of which are different from each other, and this is desirable in consideration of the producing throughput.

Note here that the power being off, the column separation data re-setting in accordance with command input becomes annulled. Therefore, it is in need of executing the column separation data re-setting at each power-on time.

In the flow shown in FIG. 11, following the command B input, address and data are input, whereby the used/unused additional column information data in the parameter register 8*a* are rewritten. By contrast, it is possible to make the command B have not only a "rewrite-direction" function for the used/unused additional column information data but also a "to-be-rewritten range direction" function.

FIG. 12 shows such the multifunctional additional column separation re-setting commands B1, B2 and B3 in correspondence with the command B at the step S21 shown in FIG. 11. There is shown here such a case that the entire additional columns are 64; and the entire additional columns are separated through the initial set-up operation at the power-on time.

Command B1 directs the chip to use 32 additional columns (i.e. separate 32 columns); command B2 to use 48 additional columns (i.e., separate 16 columns); and command B3 to use the entire, 64, additional columns (i.e., separate no columns).

Either one of these commands being input, the used/unused additional column information data in the parameter register 8a are rewritten in accordance with the input command. Then, command C being input for directing the column separation (step S24), the internal controller 10 resets the entire column separation-use data latches in a lump (step S25). Following it, based on the partially rewritten data in the parameter register 8a, defective column separation (step S26), unused redundant column separation (step S27) and unused additional column separation (step S28) are sequentially performed.

The additional column separation step S28 is executed based on the rewritten used/unused additional column information data in the parameter register 8a. Therefore, in accordance with the direction of the command B1, B2 or B3, either one of 32-additional column separation, 16-additional column separation and no additional column separation will be selected.

While the read-verify operation in the data write mode has been explained above, the batch verify circuit 13 may be used in the data erase mode. Data erase is performed by repeat of an erase voltage application operation and an erase-verify operation block by block. Although the erase-verify read is different from the write-verify read in the bias condition, the basic scheme is similar to that in the write-verify, and the bit line charge or discharge state will be detected with the sense amplifier circuit. Therefore, it becomes possible to do erase-verify judgment with the batch verify circuit 13 in accordance with this embodiment on the condition that inaccessible columns for users are excluded from the verify object.

In the above-described embodiment, the initial set-up data are stored in the ROM fuse area in the memory cell array 1. By contrast, all of or at least a part of the initial set-up data may be stored in another initial set-up data storage circuit such as a fuse box formed of a laser blowing type of mechanical fuse circuit or an electrically programming fuse circuit.

As another embodiment, an electric card using the non-volatile semiconductor memory devices according to the above-described embodiment of the present invention and an electric device using the card will be described bellow.

Figure 14:
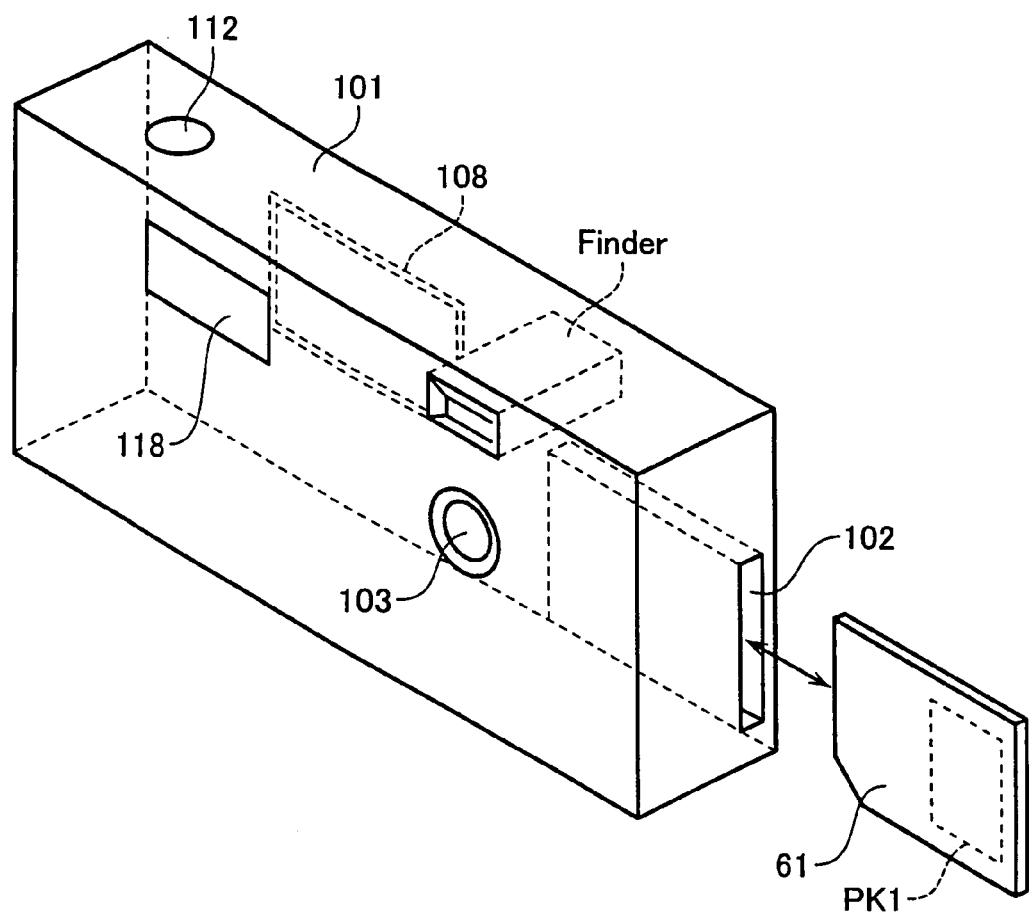
FIG. 14 shows another embodiment applied to a digital still camera.

FIG. 14 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 15:
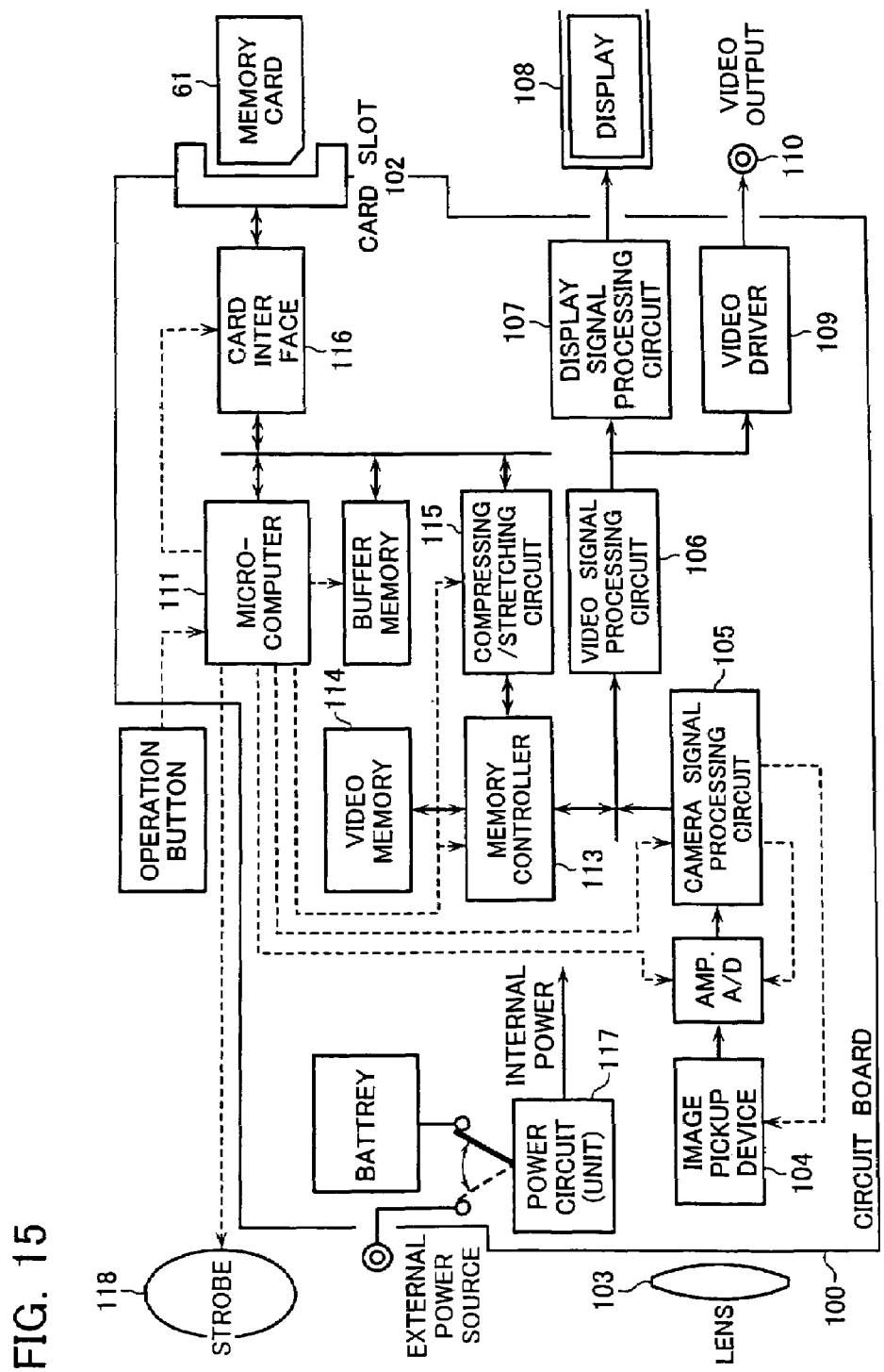
FIG. 15 shows the internal configuration of the digital still camera.
Figure 16A:
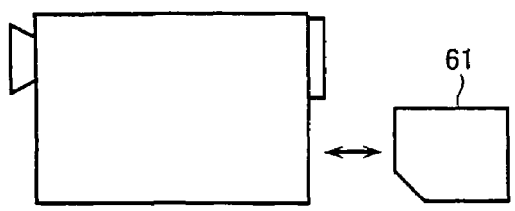
FIGS. 16A to 16J show other electric devices to which the embodiment is applied.
Figure 16F:
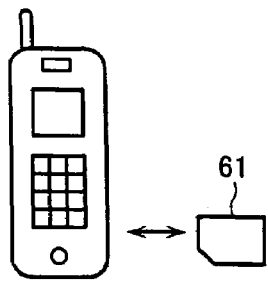
Figure 16B:
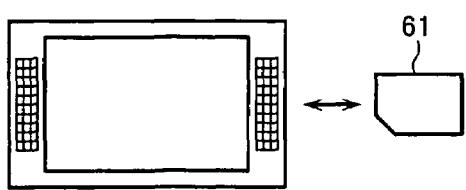
Figure 16G:
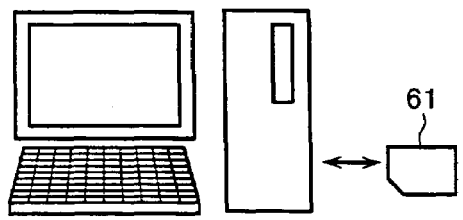
Figure 16C:
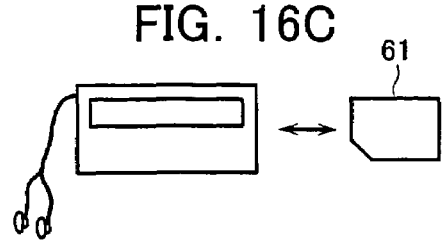
Figure 16H:
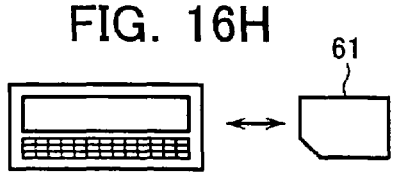
Figure 16D:
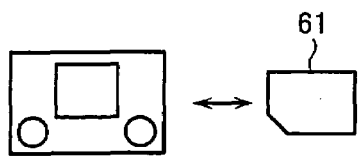
Figure 16I:
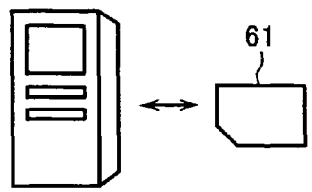
Figure 16E:
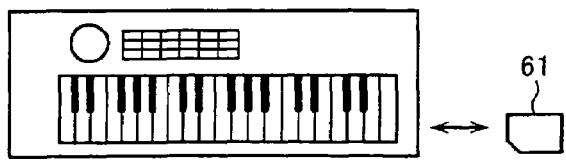
Figure 16J:
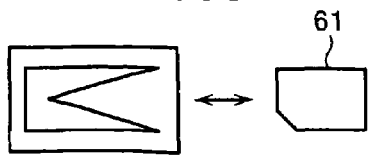

FIG. 15 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE); automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g. NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 16A to 16J, as well as in portable electric devices. That is, the electric card can also be used in a video camera shown in FIG. 16A, a television set shown in FIG. 16B, an audio apparatus shown in FIG. 16C, a game apparatus shown in FIG. 16D, an electric musical instrument shown in FIG. 16E, a cell phone shown in FIG. 16F, a personal computer shown in FIG. 16G, a personal digital assistant (PDA) shown in FIG. 16H, a voice recorder shown in FIG. 16I, and a PC card shown in FIG. 16J.

This invention is not limited to the above-described embodiment. It will be understood by those skilled in the art that various changes in form and detail may be made without departing from the spirit, scope, and teaching of the invention.

What is claimed is:

1. A semiconductor memory device comprising:
    a memory cell array with electrically rewritable and non-volatile memory cells arranged therein;
    a sense amplifier circuit configured to serve for reading and writing data of the memory cell array page by page;
    a verify-judge circuit configured to judge write or erase completion based on verify-read data held in the sense amplifier circuit; and
    data latches disposed for the respective columns in the memory cell array to be attached to the verify-judge circuit, into which column separation data are written to serve for excluding the corresponding columns from a verifying object, wherein
    the column separation data are automatically set in the data latches in an initial set-up mode at a power-on time so that at least a part of inaccessible columns for users are excluded from the verifying object.

2. The semiconductor memory device according to claim 1, wherein
    at least one of an additional column, which is closed to users except a specified user, and a redundant column, which is not used for defective column relieving, is contained in to-be-separated columns in addition to a defective column.

3. The semiconductor memory device according to claim 1, further comprising:
    an initial set-up data storage circuit set in the memory cell array or formed independently of the memory cell array to store initial set-up data including column address information and used/unused additional column information data, which are necessary for writing the column separation data; and
    data registers, to which the read out data of the initial set-up data storage circuit are transferred in the initial set-up mode, wherein
    the column separation data are automatically set in the data latches based on the initial set-up data read in the data register in the initial set-up mode.

4. The semiconductor memory device according to claim 1, wherein
    the data latches are configured to be re-settable independently of each other.

5. The semiconductor memory device according to claim 3, wherein
    the device has such an operation mode set in response to a command input that a rewrite operation of the initial set-up data stored in the data register is performed, and then re-set operation is performed for re-setting the column separation data in the data latches based on the rewritten initial set-up data.

6. The semiconductor memory device according to claim 5, wherein
    the operation mode includes:
    a first stop for rewriting a part of the initial set-up data in the data register in response to a first command; and
    a second step for re-setting the column separation data in the data latches based on the initial set-up data rewritten in the data register in response to a second command.

7. The semiconductor memory device according to claim 6, wherein
    the first command is input for directing to rewrite the initial set-up data in the data register, and following it address and data are input so that a part of the initial set-up data is rewritten.

8. The semiconductor memory device according to claim 6, wherein
    the first command has functions of: directing to rewrite the initial set-up data in the data register; and directing a rewrite range in the initial set-up data.

9. The semiconductor memory device according to claim 1, wherein
    the verify-judge circuit comprises a permissible fail number setting circuit for permitting of column defects to a certain extent.

10. The semiconductor memory device according to claim 1, wherein
    the memory cell array comprises NAND cell units arranged therein each having a plurality of the memory cells connected in series.

11. A semiconductor memory device comprising:
    a memory cell array with electrically rewritable and non-volatile memory cells arranged therein;
    a sense amplifier circuit configured to serve for reading and writing data of the memory cell array page by page;
    a verify-judge circuit configured to judge write or erase completion based on verify-read data held in the sense amplifier circuit; and
    data latches disposed for the respective columns in the memory cell array to be attached to the verify-judge circuit, into which column separation data are written to serve for excluding the corresponding columns from a verifying object, wherein
    the device has an operation mode for re-setting the column separation data in the data latches in response to a command input.

12. The semiconductor memory device according to claim 11, wherein
    the column separation data are automatically set in the data latches in an initial set-up mode at a power-on time so that at least a part of inaccessible columns for users are excluded from the verifying object.

13. The semiconductor memory device according to claim 11, wherein
    at least one of an additional column, which is closed to users except a specified user, and a redundant column, which is not used for defective column relieving, is contained in to-be-separated columns in addition to a defective column.

14. The semiconductor memory device according to claim 12, further comprising:
    an initial set-up data storage circuit set in the memory cell array or formed independently of the memory cell array to store initial set-up data including column address information and used/unused additional column information data, which are necessary for writing the column separation data; and data registers, to which the read out data of the initial set-up data storage circuit are transferred in the initial set-up mode, wherein the column separation data are automatically set in the data latches based on the initial set-up data read in the data register in the initial set-up mode.

15. The semiconductor memory device according to claim 14, wherein in the operation mode, a rewrite operation of the initial set-up data stored in the data register is performed, and then re-set operation is performed for re-setting the column separation data in the data latches based on the rewritten initial set-up data.

16. The semiconductor memory device according to claim 15, wherein the operation mode includes:

a first step for rewriting a part of the initial set-up data in the data register in response to a first command; and a second step for re-setting the column separation data in the data latches based on the initial set-up data rewritten in the data register in response to a second command.

17. The semiconductor memory device according to claim 16, wherein the first command is input for directing to rewrite the initial set-up data in the data register, and following it address and data are input so that a part of the initial set-up data is rewritten.

18. The semiconductor memory device according to claim 16, wherein the first command has functions of: directing to rewrite the initial set-up data in the data register; and directing a rewrite range in the initial set-up data.

19. The semiconductor memory device according to claim 11, further comprising:

a permissible fail number setting circuit configured to be attached to the verify-judge circuit for permitting of column defects to a certain extent.

20. The semiconductor memory device according to claim 11, wherein the memory cell array comprises NAND cell units arranged therein each having a plurality of the memory cells connected in series.

* * * * *